United States Patent
Sargunas (10) Patent No.: US 9,006,104 B2
(45) Date of Patent: Apr. 14, 2015

(54) METHODS OF FORMING METAL SILICIDE REGIONS ON SEMICONDUCTOR DEVICES USING MILLISECOND ANNEALING TECHNIQUES

(71) Applicant: GLOBALFOUNDRIES Inc., Grand Cayman, KY (US)

(72) Inventor: Vidmantas Sargunas, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 38 days.

(21) Appl. No.: 13/910,430

(22) Filed: Jun. 5, 2013

(65) Prior Publication Data

US 2014/0363972 A1    Dec. 11, 2014

(51) Int. Cl.
H01L 21/44        (2006.01)
H01L 21/285       (2006.01)

(52) U.S. Cl.
CPC ................... *H01L 21/28518* (2013.01)

(58) Field of Classification Search
None
See application file for complete search history.

(56) References Cited

U.S. PATENT DOCUMENTS

| | | | |
|---|---|---|---|
| 4,683,645 A | 8/1987 | Naguib et al. | |
| 4,830,971 A | 5/1989 | Shibata | |
| 5,268,317 A | 12/1993 | Schwalke et al. | |
| 5,470,794 A | 11/1995 | Anjum et al. | |
| 5,627,105 A | 5/1997 | Delfino et al. | |
| 5,789,318 A | 8/1998 | Delfino et al. | |
| 5,976,711 A | 11/1999 | Dearnaley | |
| 6,297,135 B1 | 10/2001 | Talwar et al. | |
| 6,387,803 B2 | 5/2002 | Talwar et al. | |
| 6,750,124 B1 | 6/2004 | Mitan et al. | |
| 7,271,486 B2 | 9/2007 | Cabral, Jr. et al. | |
| 7,419,907 B2 | 9/2008 | Detavernier et al. | |
| 7,732,870 B2 | 6/2010 | Detavenier et al. | |
| 8,349,732 B2 * | 1/2013 | Chuang et al. | 438/664 |
| 2001/0012693 A1 | 8/2001 | Talwar et al. | |
| 2004/0123922 A1 | 7/2004 | Cabral, Jr. et al. | |
| 2005/0185173 A1 | 8/2005 | Hau-Riege | |
| 2006/0183267 A1 | 8/2006 | Roccaforte et al. | |
| 2007/0072391 A1 | 3/2007 | Pocas et al. | |
| 2007/0249149 A1 | 10/2007 | Deshpande et al. | |
| 2008/0217781 A1 | 9/2008 | Detavernier et al. | |
| 2009/0035523 A1 | 2/2009 | Takayanagi et al. | |
| 2010/0028572 A1 | 2/2010 | Kobayashi et al. | |
| 2012/0083089 A1 * | 4/2012 | Kim et al. | 438/301 |
| 2013/0334693 A1 * | 12/2013 | Alptekin et al. | 257/769 |

* cited by examiner

*Primary Examiner* — Angel Roman
(74) *Attorney, Agent, or Firm* — Amerson Law Firm, PLLC (57) ABSTRACT

In one example, the method includes forming a metal layer on a silicon-containing structure, after forming the metal layer, performing an ion implantation process to implant silicon atoms into at least one of the metal layer and the silicon-containing structure and performing a first millisecond anneal process so as to form a first metal silicide region in the silicon-containing structure.

22 Claims, 7 Drawing Sheets

METHODS OF FORMING METAL SILICIDE REGIONS ON SEMICONDUCTOR DEVICES USING MILLISECOND ANNEALING TECHNIQUES

BACKGROUND OF THE INVENTION

1. Field of the Invention

Generally, the present disclosure relates to the manufacture of semiconductor devices, and, more specifically, to various methods of forming metal silicide regions on semiconductor devices that involve performing at least one millisecond anneal process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Figure 1A:
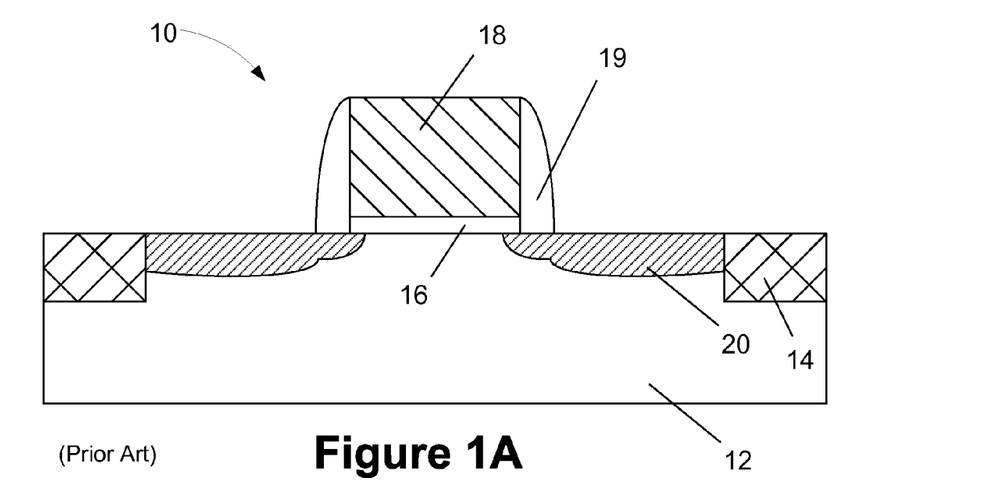
FIGS. 1A-1F depict various aspects of prior art methods used to form metal silicide regions on semiconductor devices.

In a field effect transistor, metal silicide regions are typically formed in the source/drain regions of a transistor to reduce the resistance when a conductive contact is formed to establish electrical connection to the source/drain regions. FIGS. 1A-1D depict one illustrative prior art method for metal silicide regions on a transistor device 10. As shown in FIG. 1A, the basic transistor structure 10 is formed in and above a semiconducting substrate 12 in an active area defined by a shallow trench isolation structure 14. At the point of fabrication depicted in FIG. 1A, the device 10 includes a gate insulation layer 16, a polysilicon gate electrode 18, sidewall spacers 19 and source/drain regions 20 formed in the substrate 12. The source/drain regions 20 may be comprised of implanted dopant materials (N-type dopants for NMOS devices and P-type dopants for PMOS devices) that are implanted into the substrate 12 using known masking and ion implantation techniques.

Figure 1B:
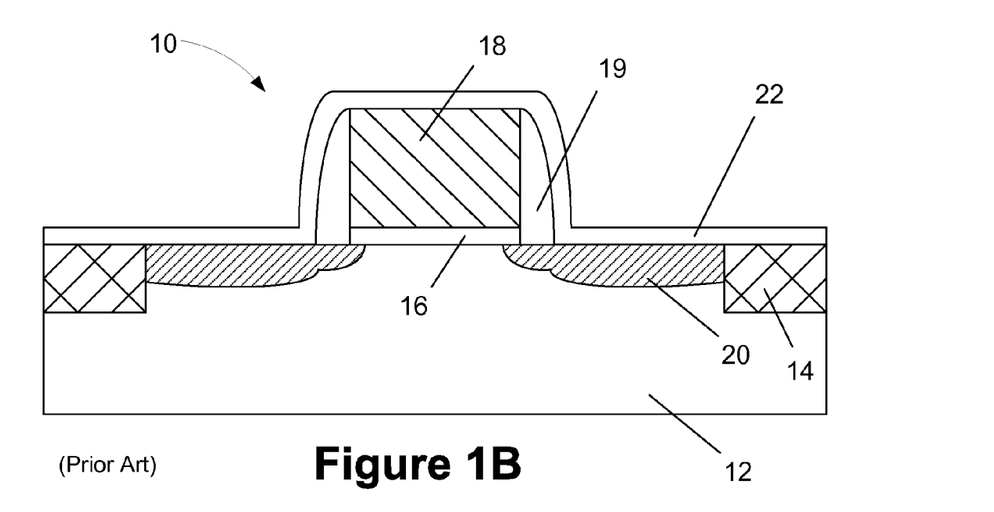

Next, as shown in FIG. 1B, a layer of metal 22, such as nickel, cobalt, titanium, platinum, etc., or a combination of such materials, is deposited above the device such that it contacts the exposed portions of the silicon-containing source/drain regions 20 and the polysilicon gate electrode 18. In some cases, a pre-amorphization ion implant process may be performed on at least the source/drain regions 20 prior to the formation of the layer of metal 22. The pre-amorphization implant process is typically performed with relatively large inert ions, and the purpose of such an implant process is to make the implanted region more receptive to the formation of a metal silicide region therein.

Figure 1C:
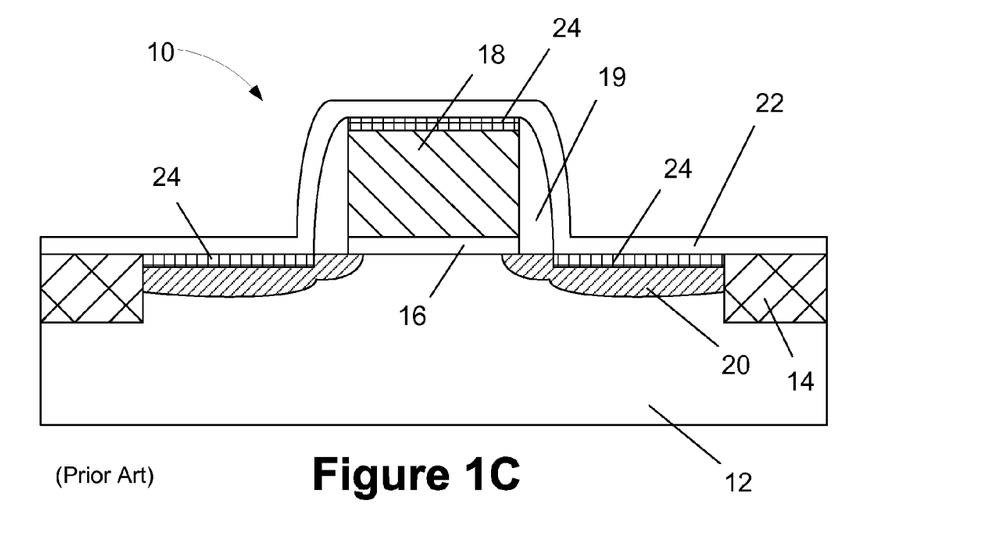

FIG. 1C depicts the device 10 after a first rapid thermal anneal (RTA) process was performed at a temperature that falls within the range of about 220-300° C. (for NiSi) for a duration of about 1.5 seconds or longer. During this first RTA process, the metal in the layer of metal 22 reacts with the silicon in the silicon-containing regions contacted by the layer of metal to thereby form a relatively higher resistance form of metal silicide 24, e.g., a nickel disilicide ($NiSi_2$), in the portions of the source/drain regions 20 and the gate electrode 18 that are in contact with the layer of metal 22.

Figure 1D:
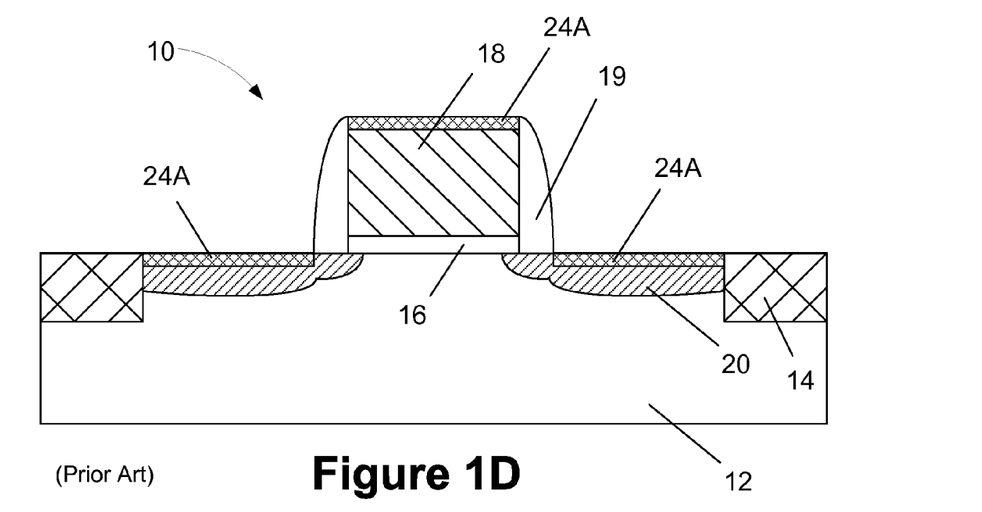

FIG. 1D depicts the device 10 after several process operations were performed. First, portions of the layer of metal 22 that did not react with the underlying silicon-containing materials during the first RTA process are removed by performing a standard stripping process. After the removal of the unreacted portions of the layer of metal 22, a second rapid thermal anneal (RTA) process is performed on the device 10 at a temperature that falls within the range of about 400-500° C. (for NiSi) for a duration of about 1.5 seconds or longer. This second RTA process converts the relatively higher resistance silicide region 24 into a relatively lower resistance silicide region 24A, e.g., nickel monosilicide (NiSi), that is positioned in the source/drain regions 20 and in the gate electrode 18. While this basic silicide formation process is depicted as being formed on the entire exposed surface area of the source/drain regions 20, in more advanced and more densely packed integrated circuit products, the silicide layer 24A may only be formed on the portion of the source/drain regions 20 that is exposed when a contact opening is formed in a layer of insulating material so as to establish electrical contact to the source/drain region by the ultimate formation of a conductive contact in the contact opening.

Figure 1E:
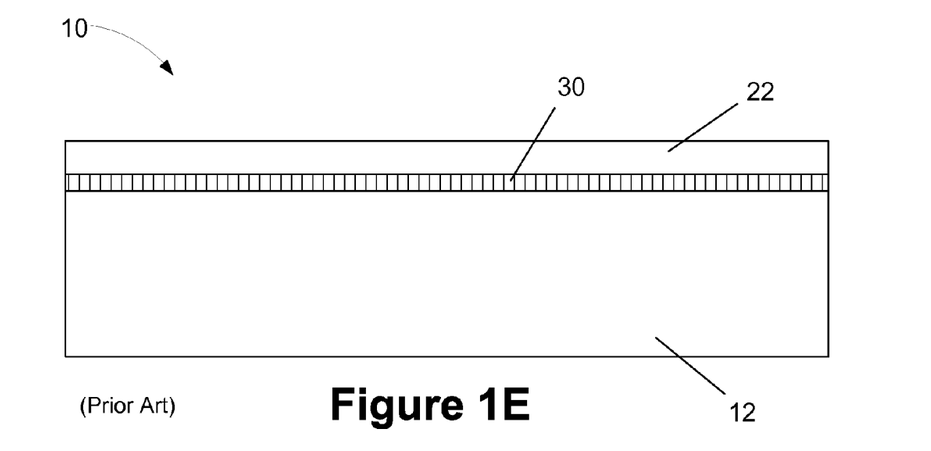
Figure 1F:
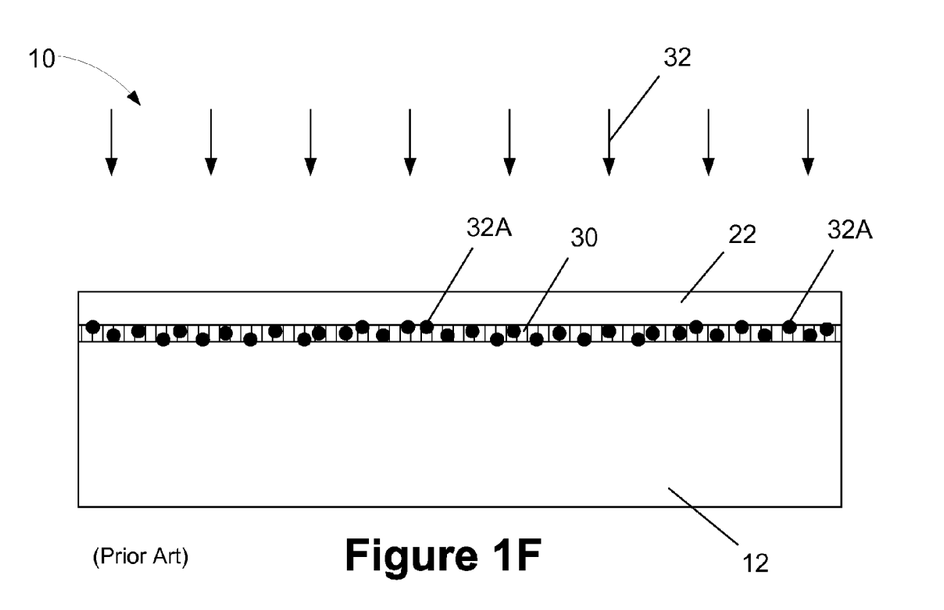

In an effort to reduce the temperatures necessary to form metal silicide regions, manufacturers utilize a concept known as "ion beam mixing" (IBM), which will be simplistically described with reference to FIGS. 1E-1F. FIG. 1E depicts an enlarged view of a portion of the substrate 12 where the above-described layer of metal 22 will be formed so as to ultimately form a metal silicide region 24A in the substrate 12. In general, prior to the formation of the layer of metal 22, the surface of the substrate 12 is cleaned as thoroughly as possible in an attempt to insure that the surface is free of all foreign materials. Despite the best efforts of manufacturers, a very thin layer of silicon dioxide 30, sometimes referred to as an interfacial oxide layer, will normally form on the substrate 12 after it has been cleaned and before the layer of metal 22 can be formed on the substrate 12. Although the layer of silicon dioxide 30 is depicted as being uniformly formed across the surface of the substrate 12, it may not be so uniformly formed in all application. The presence of the layer of silicon dioxide can undesirably increase the resistance of the final silicide region 24A.

Ion beam mixing generally involves irradiating the interface between the layer of metal 22 and the substrate 12 with a beam of silicon or other ions prior to performing an annealing step. FIG. 1F schematically depicts an illustrative ion beam mixing process 32 wherein silicon atoms 32A are introduced at or near the interface between the metal layer 22 and the substrate 12. Accordingly, the interface, and the demarcation between two materials at the interface juncture, can be "smeared" by the silicon ions. Reaction between the two materials on either side of the smeared junction can thereby proceed at a lower temperature.

The present disclosure is directed to various methods of forming metal silicide regions on semiconductor devices that involve performing at least one millisecond anneal process that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming metal silicide regions on semiconductor devices that involve performing at least one millisecond anneal process. In one example, the method includes forming a metal layer on a silicon-containing structure, after forming the metal layer, performing an ion implantation process to implant silicon atoms into at least one of the metal layer and the silicon-containing structure, and performing a first millisecond anneal process at a temperature that falls within the range of 400-700° C. for a duration of less than one millisecond so as to form a first metal silicide region in the silicon-containing structure.

In another illustrative example, a method disclosed herein includes forming a metal layer on a silicon-containing structure, after forming the metal layer, performing an ion implantation process to implant silicon atoms into at least one of the metal layer and the silicon-containing structure, wherein the ion implantation process is performed at a temperature less than or equal to −50° C., performing a first millisecond anneal process for a duration of less than one millisecond so as to form a first metal silicide region in the silicon-containing structure, after forming the first metal silicide region, stripping portions of the metal layer and performing a second millisecond anneal process for a duration of less than one millisecond so as to convert the first metal silicide region into a second metal silicide region that has a lower resistance than that of the first metal silicide region.

Yet another illustrative method disclosed herein includes forming a metal layer on a silicon-containing structure, after forming the metal layer, performing an ion implantation process to implant silicon atoms into at least one of the metal layer and the silicon-containing structure, wherein the ion implantation process is performed at a temperature that falls within the range of −50 to −100° C. using a dopant dose that falls within the range of 3-5 $e^{15}$ atom/cm$^2$, performing a first millisecond anneal process at a temperature that falls within the range of 400-700° C. for a duration of less than one millisecond so as to form a first metal silicide region in the silicon-containing structure, after forming the first metal silicide region, stripping portions of the metal layer and performing a second millisecond anneal process at a temperature that falls within the range of 600-850° C. for a duration of less than one millisecond so as to convert the first metal silicide region into a second metal silicide region that has a lower resistance than that of the first metal silicide region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming metal silicide regions on semiconductor devices that involve performing at least one millisecond anneal process. As will be readily apparent to those skilled in the art upon a complete reading of the present application, the methods disclosed herein may be employed when forming silicide regions when manufacturing products using a variety of technologies, e.g., NMOS, PMOS, CMOS, etc., and they may be employed when manufacturing a variety of different integrated circuit products, including, but not limited to, logic devices, memory devices, ASICs, etc. With reference to the attached figures, various illustrative embodiments of the methods disclosed herein will now be described in more detail.

As will be described more fully below, the methods disclosed herein may be employed to form metal silicide regions on a silicon-containing material in an integrated circuit product. For example, the methods disclosed herein may be employed in forming a metal silicide region on a source/drain region of a transistor device, the gate electrode of such a transistor or a portion of an active region that will serve as a resistor in an integrated circuit. Thus, the presently disclosed inventions should not be considered to be limited to use in forming metal silicide regions on any particular type of structure or component of an integrated circuit product or semiconductor device.

Figure 2A:
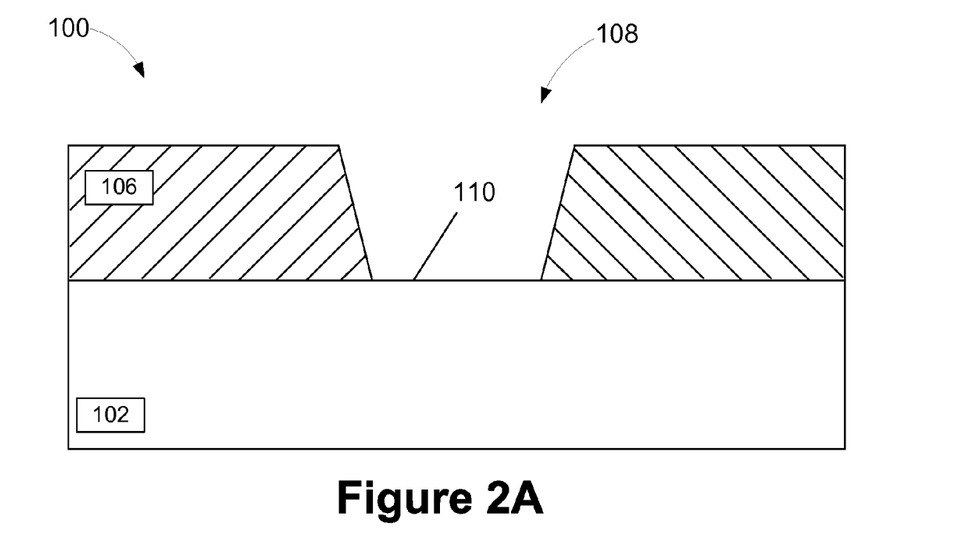
FIGS. 2A-2G depict various illustrative examples disclosed herein for forming metal silicide regions on semiconductor devices that involve performing at least one millisecond anneal process.

FIG. 2A is a simplified view of an illustrative integrated circuit product 100 at an early stage of manufacturing. As depicted, a layer of insulating material 106 has been formed above a silicon-containing structure 102. A contact opening 108 has been formed in the layer of insulating material 106 so as to expose a contact region 110 of the silicon-containing structure 102 where a metal silicide region will be formed using one of the methods disclosed herein. As indicated above, the silicon-containing structure 102 is intended to be representative of any of a variety of different types of areas or regions of an integrated circuit product wherein it is desired to form metal silicide regions, e.g., a source/drain region of a transistor, a polysilicon gate electrode, etc. In the illustrative case wherein the silicon-containing structure 102 is a semiconductor substrate, such a substrate may have a variety of configurations, such as a bulk silicon configuration, or it may be the active layer of a silicon-on-insulator (SOI) substrate. The silicon-containing structure 102 may be made of any silicon-containing material, e.g., substantially pure crystalline silicon, polysilicon, silicon germanium, pure germanium, etc.

The layer of insulating material 106 shown in FIG. 2A may be comprised of a variety of different materials, such as, for example, a low-k (k value less than about 3.3), a high-k material (k value greater than 10), silicon dioxide, silicon nitride, silicon oxynitride, etc. The layer of insulating material 106 may be formed by performing a variety of processes and its thickness may vary depending upon the particular application. In one illustrative embodiment, the layer of insulating material 106 is a layer of silicon dioxide that is formed by performing a chemical vapor deposition (CVD) process. The contact opening 108 within the layer of insulating material 106 may be of any size, shape or configuration, and it may be formed by performing any of a variety of known etching processes through a patterned mask layer (not shown) comprised of, for example, a patterned layer of photoresist material. The etching process may be either a wet or dry etching process. In some cases, the methods disclosed herein may be employed to form a metal silicide region on all or a portion of the silicon-containing structure 102 without having to form the illustrative layer of insulating material 106. Formation of the contact opening 108 exposes the contact region 110 where it is desired to form a metal silicide region on the silicon-containing structure 102.

Figure 2B:
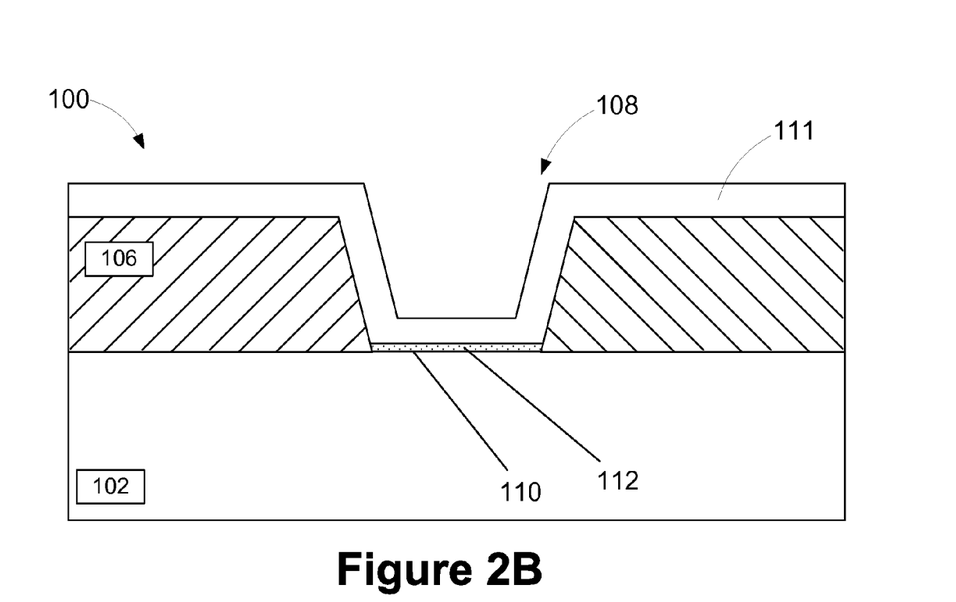

FIG. 2B depicts the product 100 after several process operations were performed. First, a cleaning process was performed on the contact region 110 in an effort to insure that the surface of the silicon-containing structure 102 within the contact opening 108 is free and clear of any foreign materials. As depicted, despite the best efforts of manufacturers, it will sometimes be the case that a very thin layer of silicon dioxide 112, i.e., an interfacial oxide layer, will form on the contact region 110 after the cleaning process is performed. So as not to obscure the present inventions, the illustrative interfacial oxide layer 112 will not be depicted in any of the subsequent drawings. In some cases, such an interfacial oxide layer 112 may not form, or at least not uniformly cover the contact region 110 as depicted in FIG. 2B. Next, a layer of metal 111, e.g., a refractory metal such as nickel, cobalt, titanium, platinum, nickel-platinum, etc., or a combination of such materials, was deposited above the layer of insulating material 106 and in the contact opening 108. In some cases, prior to the deposition of the layer of metal 111, a pre-amorphization ion implant process may have been performed on the silicon-containing structure 102 prior to the formation of the layer of insulating material 106 or such a pre-amorphization ion implant process may be performed on just the exposed contact region 110. The pre-amorphization implant process is typically performed with relatively large inert ions, and the purpose of such an implant process is to make the amorphized region more receptive to the formation of a metal silicide region therein. The thickness of the layer of metal 111 may vary depending on the particular application, e.g., 10-30 nm, and it may be formed by a variety of processes, e.g., physical vapor deposition (PVD).

Figure 2C:
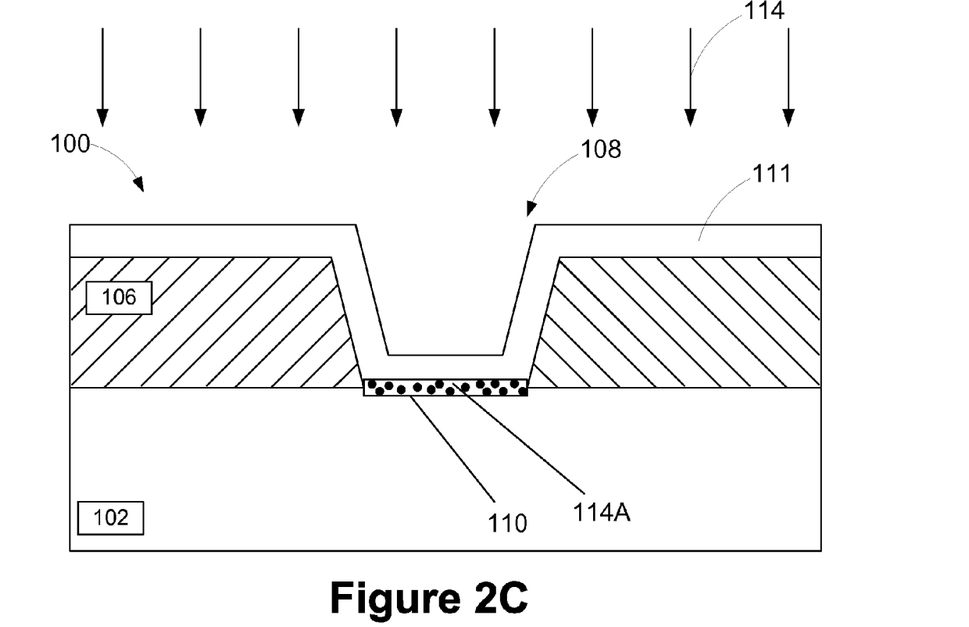

FIG. 2C depicts the product 100 after an ion beam mixing (IBM) process 114 was performed to form an implant region 114A comprised of illustrative implanted silicon atoms (the black dots) at or near the interface between the silicon-containing structure 102 and the layer of metal 111 within the contact opening 108. The added silicon atoms will be available during the subsequent process operations that are performed to form the metal silicide region. The dopant dose of the ion beam mixing process 114 may vary depending on the particular application, e.g., 3-5 $e^{15}$ atom/cm$^2$. The energy of the ion beam mixing process 114 may also vary depending upon the particular application but it is typically controlled such that the peak distribution ($R_p$) of the implanted silicon atoms is at or near the interface between the layer of metal 111 and the silicon-containing structure 102. The ion beam mixing process 114 creates an amorphized or damaged region (not shown) in the silicon-containing structure 102. However, the depth of the amorphized region is typically relatively shallow as the maximum damage to the silicon-containing structure 102 during the ion beam mixing process 114 occurs within a vertical region defined by 0.8 $R_p$ distribution levels, thereby tending to limit the depth of the damage to the underlying silicon-containing structure 102. In one illustrative embodiment, the implant energy used during the ion beam mixing process 114 may be about 15-50 keV. In one illustrative embodiment, the ion beam mixing process 114 may be performed at a relatively low temperature, e.g., −50 to −100° C., so as to produce deeper amorphous layers. By performing the ion beam mixing process 114 at this lower temperature, defect self-annealing of the amorphized region of the silicon-containing structure 102 is greatly suppressed due to reduced point defect mobility. In some cases, so-called end-of-range (EOR) defects may be substantially consumed by the amorphous region formed in the silicon-containing structure 102 during the ion beam mixing process 114, thereby creating a region with an otherwise lower defect density. In the case where the silicon-containing structure 102 is a doped source/drain region, such lower defect densities may reduce leakage currents on a transistor device.

Figure 2D:
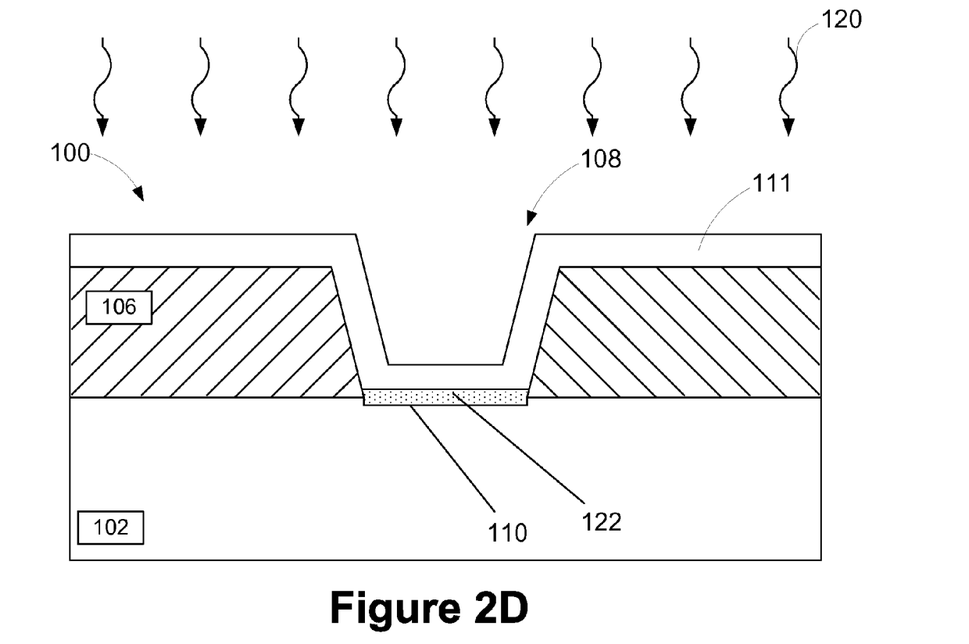

FIG. 2D depicts the product 100 after a first millisecond anneal (MSA) process 120, e.g., a flash or laser anneal process, was performed at a temperature that falls within the range of about 400-700° C. (400-500° C. for NiSi) for a duration of less than one millisecond. During the first millisecond anneal process 120, the metal in the layer of metal 111 reacts with the silicon in the silicon-containing structure 102 to thereby form a relatively higher resistance form of metal silicide 122. Due to the extremely short duration of the first millisecond anneal process 120, very little, if any, of the metal in the layer of metal 111, e.g., nickel, diffuses into the underlying silicon-containing structure 102. As a result, problems such as so-called "nickel piping" may be reduced.

Figure 2E:
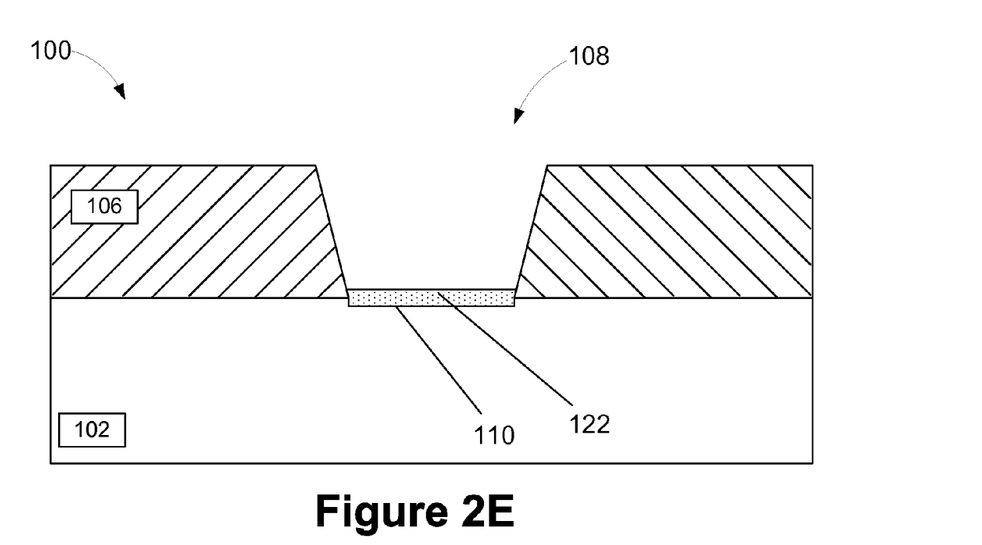

FIG. 2E depicts the product 100 after portions of the layer of metal 111 that did not react with the underlying silicon-containing structure 102 during the first millisecond anneal process 120 are removed by performing a standard stripping process.

Figure 2F:
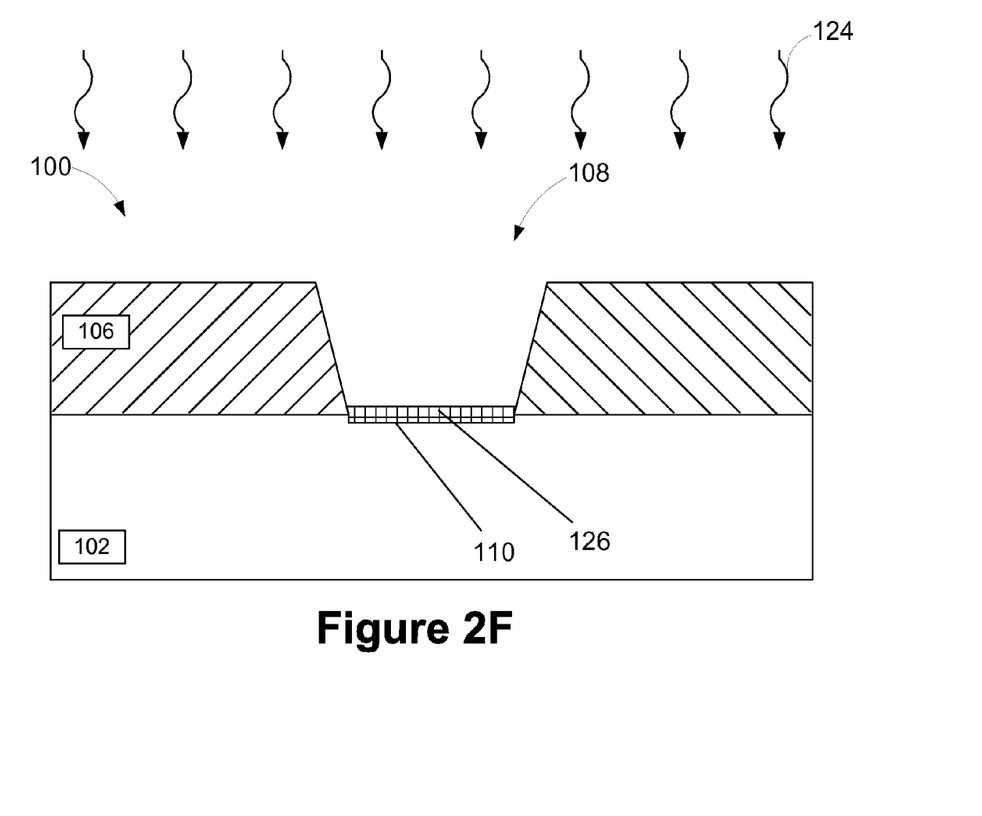

FIG. 2F depicts the product 100 after a second millisecond anneal (MSA) process 124, e.g., a flash or laser anneal process, was performed at a temperature that falls within the range of about 600-850° C. for a duration of less than one millisecond. The second millisecond anneal process 124 converts the relatively higher resistance silicide region 122 into a relatively lower resistance silicide region 126, e.g., NiPtSi. The thickness of the metal silicide region 126 may vary depending upon the application, e.g., 1-10 nm.

Figure 2G:
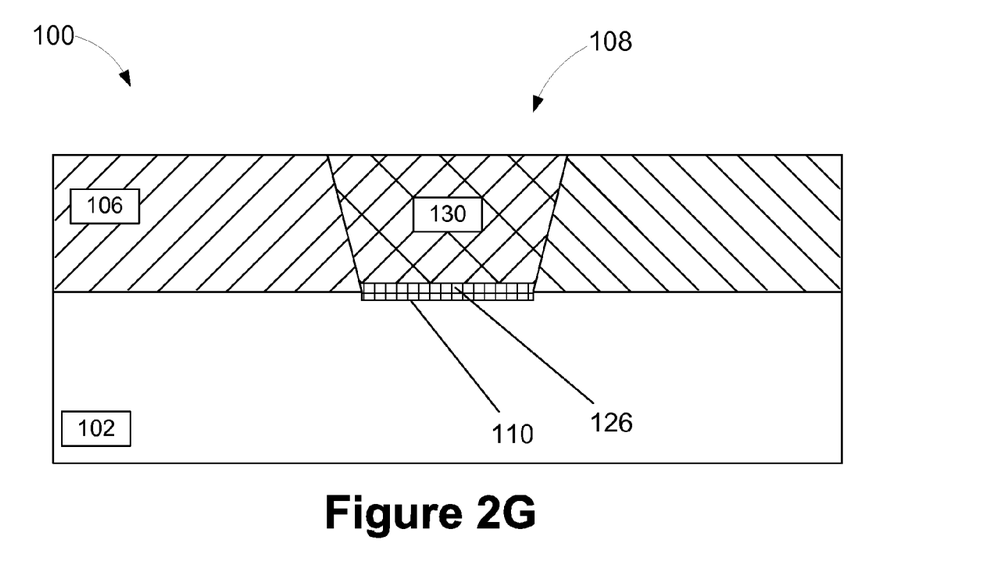

FIG. 2G depicts the product 100 after an illustrative conductive contact structure 130 is formed in the contact opening 108 using traditional manufacturing techniques. As depicted, the conductive contact structure 130 is conductively coupled to the metal silicide region 126, which is conductively coupled to the silicon-containing structure 102. The conductive contact structure 130 is intended to be representative in nature as it may be comprised of any of a variety of different conductive materials, such as tungsten or cobalt. The conductive structure 130 may also include one or more barrier/adhesion layers that are formed in the contact opening 108, but such barrier/adhesion layers are not depicted in the attached drawings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a metal layer on a silicon-containing structure;
    after forming said metal layer, performing an ion implantation process to implant silicon atoms into at least one of said metal layer and said silicon-containing structure;
    performing a first millisecond anneal process at a temperature that falls within the range of 400-700° C. for a duration of less than one millisecond so as to form a first metal silicide region in said silicon-containing structure; and
    performing a second millisecond anneal process on said first metal silicide for a duration of less than one millisecond.

2. The method of claim 1, further comprising, after forming said first metal silicide region and prior to performing said second millisecond anneal process, stripping portions of said metal layer.

3. The method of claim 2, wherein said second millisecond anneal process is performed at a temperature that falls within the range of 600-850° C. so as to convert said first metal silicide region into a second metal silicide region that has a lower resistance than that of said first metal silicide region.

4. The method of claim 1, wherein performing said ion implantation process comprises performing said ion implantation process at a temperature that is less than or equal to $-50°$ C.

5. The method of claim 1, wherein performing said ion implantation process comprises performing said ion implantation process at a temperature that falls within the range of $-50$ to $-100°$ C.

6. The method of claim 1, wherein performing said ion implantation process comprises performing said ion implantation process using a dopant dose that falls within the range of $3\text{-}5\,e^{15}$ atoms/cm$^2$.

7. The method of claim 6, wherein performing said ion implantation process comprises performing said ion implantation process using an energy level that falls within the range of 15-50 keV.

8. The method of claim 1, wherein said metal layer is comprised of a refractory metal.

9. The method of claim 1, wherein said metal layer is comprised of nickel, cobalt, titanium, platinum or a combination of such materials.

10. The method of claim 1, wherein said silicon-containing structure is comprised of one of crystalline silicon, polysilicon, germanium or silicon-germanium.

11. The method of claim 1, wherein said silicon-containing structure is a doped source/drain region of a transistor device.

12. A method, comprising:
    forming a metal layer on a silicon-containing structure;
    after forming said metal layer, performing an ion implantation process to implant silicon atoms into at least one of said metal layer and said silicon-containing structure, wherein said ion implantation process is performed at a temperature less than or equal to $-50°$ C.;
    performing a first millisecond anneal process for a duration of less than one millisecond so as to form a first metal silicide region in said silicon-containing structure;
    after forming said first metal silicide region, stripping portions of said metal layer; and
    performing a second millisecond anneal process for a duration of less than one millisecond so as to convert said first metal silicide region into a second metal silicide region that has a lower resistance than that of said first metal silicide region.

13. The method of claim 12, wherein said first millisecond anneal process is performed at a temperature that falls within the range of 400-700° C.

14. The method of claim 13, wherein said second millisecond anneal process is performed at a temperature that falls within the range of 600-850° C.

15. The method of claim 12, wherein said ion implantation process is performed at a temperature that falls within the range of $-50$ to $-100°$ C.

16. The method of claim 12, wherein performing said ion implantation process comprises performing said ion implantation process using a dopant dose that falls within the range of $3\text{-}5\,e^{15}$ atoms/cm$^2$.

17. The method of claim 16, wherein performing said ion implantation process comprises performing said ion implantation process using an energy level that falls within the range of 15-50 keV.

18. A method, comprising:
    forming a metal layer on a silicon-containing structure;
    after forming said metal layer, performing an ion implantation process to implant silicon atoms into at least one of said metal layer and said silicon-containing structure, wherein said ion implantation process is performed at a temperature that falls within the range of $-50$ to $-100°$ C. using a dopant dose that falls within the range of $3\text{-}5\,e^{15}$ atoms/cm$^2$;
    performing a first millisecond anneal process at a temperature that falls within the range of 400-700° C. for a duration of less than one millisecond so as to form a first metal silicide region in said silicon-containing structure;

after forming said first metal silicide region, stripping portions of said metal layer; and performing a second millisecond anneal process at a temperature that falls within the range of 600-850° C. for a duration of less than one millisecond so as to convert said first metal silicide region into a second metal silicide region that has a lower resistance than that of said first metal silicide region.

19. The method of claim 18, wherein performing said ion implantation process comprises performing said ion implantation process using an energy level that falls within the range of 15-50 keV.

20. The method of claim 18, wherein said metal layer is comprised of a refractory metal.

21. The method of claim 1, wherein said second millisecond anneal process is performed at a temperature that falls within the range of 600-850° C.

22. The method of claim 1, wherein said first metal silicide region is converted into a second metal silicide region that has a lower resistance than that of said first metal silicide region during said second millisecond anneal process.

* * * * *